United States Patent [19]

Weiner

[11] 4,237,424
[45] Dec. 2, 1980

[54] GATED BASELINE CORRECTOR

[75] Inventor: Irving L. Weiner, Sharon, Mass.

[73] Assignee: Ortho Diagnostics, Inc., Raritan, N.J.

[21] Appl. No.: 934,939

[22] Filed: Aug. 18, 1978

[51] Int. Cl.³ .............................................. H03L 5/00
[52] U.S. Cl. ................................... 328/175; 328/149; 328/162; 328/165; 307/237; 330/11; 330/110
[58] Field of Search ............... 328/162, 165, 163, 169, 328/151, 175, 146, 147, 149, 108, 173; 307/353, 237; 330/11, 110

[56] References Cited

U.S. PATENT DOCUMENTS

| | | | |
|---|---|---|---|
| 3,207,998 | 9/1965 | Corney et al. | 330/11 |
| 3,543,169 | 11/1970 | Hill | 330/11 X |
| 3,641,444 | 2/1972 | Watts | 328/163 X |
| 3,758,868 | 9/1973 | Brown | 328/175 X |
| 3,772,604 | 11/1973 | Hogg et al. | 328/169 |
| 4,119,918 | 10/1978 | Moser | 328/175 X |

Primary Examiner—John S. Heyman
Attorney, Agent, or Firm—Audley A. Ciamporcero, Jr.

[57] ABSTRACT

Input pulses are coupled through a delay network to a pulse amplifier. The amplifier includes feedback circuitry for correcting its output to a particular baseline level, generally zero volts. Within the amplifier feedback path is a gate, which is normally closed. Input pulses are also coupled to a pulse detector; whenever an input pulse is detected, the baseline gate in the amplifier feedback path is open, and the dynamic feedback operation is temporarily inhibited. During this time, the most recent previous level of baseline correction is retained.

2 Claims, 3 Drawing Figures

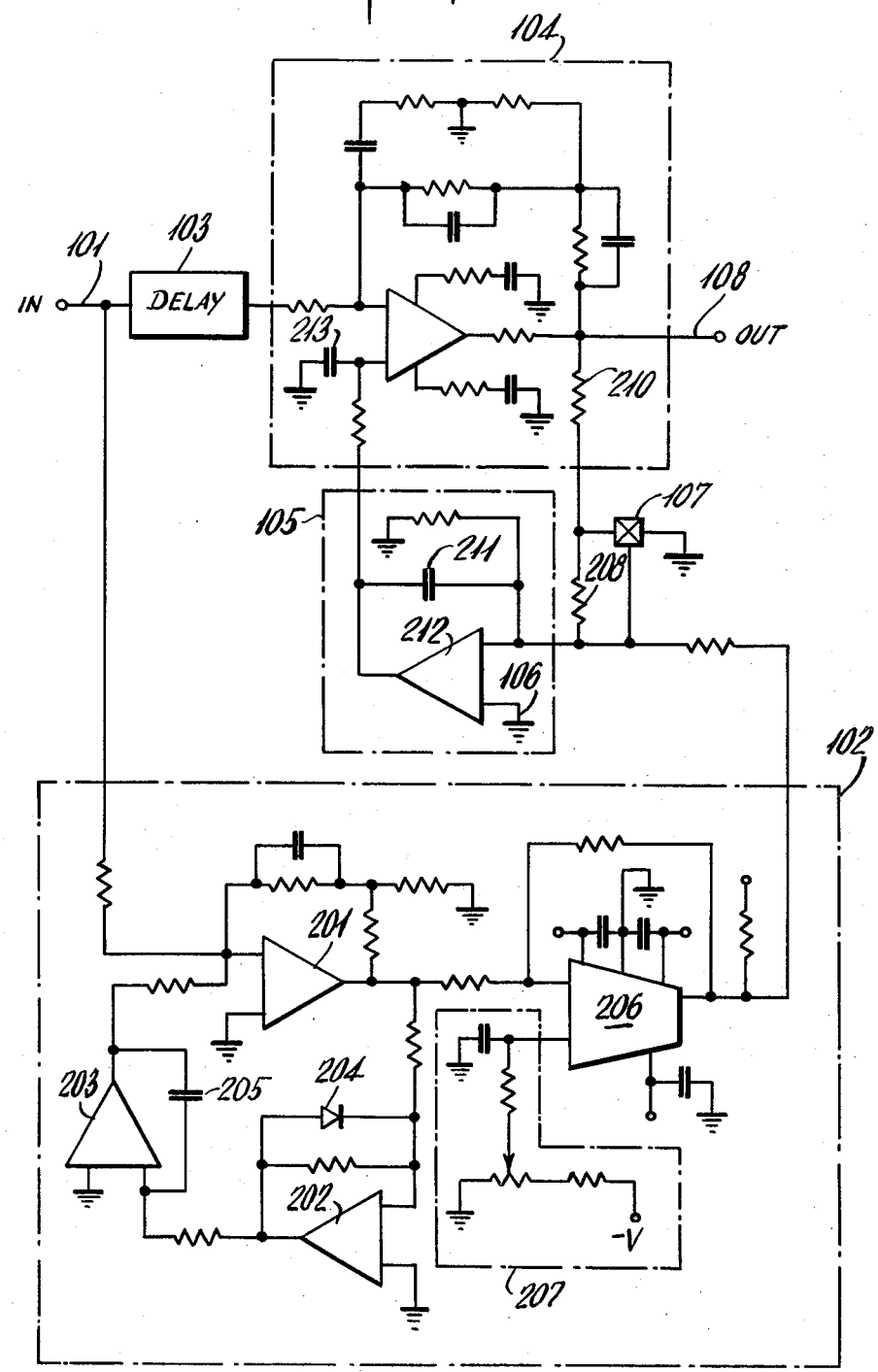

GATED BASELINE CORRECTOR

TECHNICAL BACKGROUND

This invention relates to electrical signal processing, and more particularly to methods and apparatus for maintaining, or restoring a desired baseline level.

BACKGROUND OF THE INVENTION AND PRIOR ART

In analog signal processing systems, unwanted baseline shift is a prime contributor to measurement error. That is, in the examination of linear signals, it is important that signal amplitudes be processed with respect to a given, consistent reference, datum, or baseline level. This is because the majority of signal processing systems and circuits measure all signal parameters with respect to this baseline level. Variations of the input baseline level, other than those due to the signal element of interest, perturb the true value of the parameter being measured, and introduce error into the process. It is apparent that if these errors are cascaded by virtue of successive signal processing operations, error will be severely increased.

It is therefore appropriate periodically to correct or restore the baseline to the desired level. Conventional methods include diode restoration, delay line shaping, pole zero compensation, and various schemes of adaptive subtracting circuitry. The latter approach often involves feedback apparatus in conjunction with an amplifier in the signal processing channel.

A relatively common problem in the prior art systems involves intermixing of the baseline correction and the signal to be processed, whereby the presence of signal detracts from the accuracy of the baseline restoration process. For example, in amplifier—feedback correction techniques, presence of input signal in the feedback path results in an amplitude dependent variation of the high pass corner frequency. Prior art approaches to correction of this problem include use of amplitude clipping and linear filtering.

SUMMARY OF THE INVENTION

It is an object of the present invention to provide baseline correction schemes in analog signal processing channels.

It is a more particular object of the present invention to provide baseline correction in adaptive, feedback type baseline restoration schemes, which avoid the difficulties associated with signal contamination in the feedback path.

In accordance with the principles of the present invention, a signal amplifier is provided with a baseline correction feedback network, which is dynamically functional during times at which no input signal is being processed by the amplifier, but which provides a steady state correction, rather than dynamic feedback correction, during times at which the input signal is being processed.

In an illustrative embodiment, a signal amplifier has arranged in feedback fashion a baseline corrector and a switch or gate which is normally enabled. When disabled, the gate inhibits dynamic feedback correction, instead forcing the baseline corrector to provide a constant amount of correction to the amplifier. In turn, the baseline gate in the feedback path is operated by a pulse detector, which senses the presence of input signal to be processed. At such times, the baseline gate is disabled, and with it the dynamic feedback approach is also disabled.

DESCRIPTION OF THE DRAWINGS

FIG. 3 shows a detailed schematic configuration for the embodiment of FIG. 1.

BEST MODE OF CARRYING OUT THE INVENTION

Figure 1:
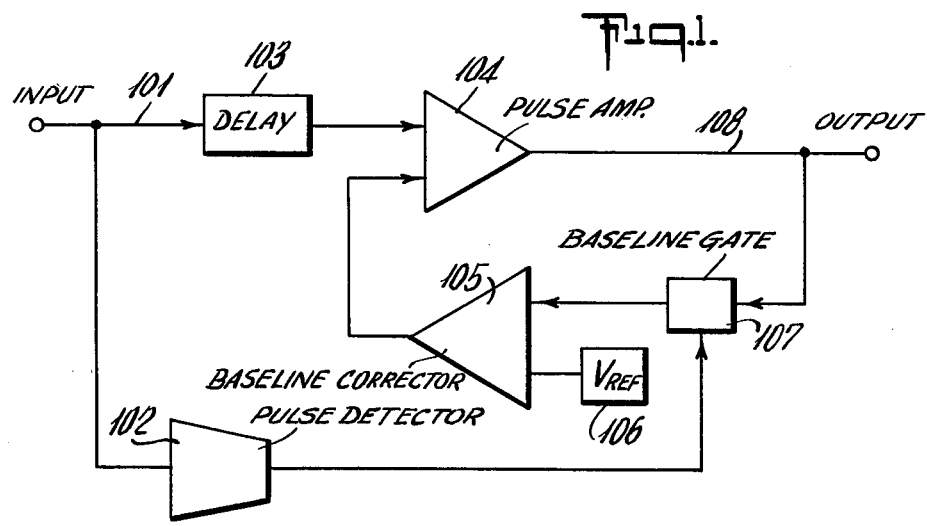
FIG. 1 shows a block diagrammatic version of a preferred embodiment of the principles of the present invention.

Referring first to FIG. 1, there is shown a block diagram version of a signal processing network embodying the principles of the present invention. Signals are processed between an input terminal 101 and an output terminal 108; in accordance with the principles of the present invention, the baseline level at output terminal 108 is to be, as nearly as possible, the desired baseline level. In most cases, this baseline level will be zero volts, but it will be appreciated that in accordance with the principles of the present invention, the baseline restoration may be accomplished with respect to any given level. The sort of signal to which the principles of the present invention are best applied are analog type signals wherein information bearing signals or pulses occur periodically and intermittently, between which are interspersed information-free periods. See, for example, waveform A of FIG. 2.

At the heart of the embodiment of FIG. 1 is an amplifier 104 which has appropriate signal amplification and shaping properties with respect to the input signal to be applied at 101. Connected in feedback configuration with respect to the amplifier 101 is a baseline gate 107 and a baseline corrector 105. As shown, the amplifier 104, as well as the baseline corrector 105, each involve a dual input configuration. In conventional fashion, the correction signal from amplifier 105 is applied to one terminal of the pulse amplifier 104, in order to correct the baseline level of output terminal 108 to the desired level. In turn, the baseline corrector 105 derives its correction signal based on a difference between the level at output terminal 108 (coupled to the corrector 105 in a loss-free fashion via baseline gate 107), and a voltage reference supply 106. The reference voltage from supply 106 corresponds to the desired baseline level; in most cases, the desired baseline level will be zero volts, in which case the reference source 106 will be a connection to ground. Hence, whenever the baseline gate is enabled (i.e. the output signal from terminal 108 is coupled to one terminal of corrector 105), the corrector 105 supplies a correction signal to one input of the amplifier 104, in order to drive the output level at 108 in the direction of the baseline level, as established by reference source 106. For purposes of normal baseline restoration operation, the baseline gate is enabled, coupling output terminal 108 to the baseline corrector 105.

In accordance with the principles of the present invention, during such times as information bearing signals or pulses arrive at input terminal 101, the baseline gate 107 is to be disabled, whereupon the baseline corrector 105 continues to supply to amplifier 104 the same correction signal which the corrector 105 most recently had been providing, on a dynamic feedback basis, before the baseline gate 107 was disabled. This signal or pulse sensing and consequent disablement of the baseline gate 107 occurs by virtue of the operation of a pulse detector 102. Hence, during intersignal or interpulse periods, the baseline corrector 105 functions in conjunction with amplifier 104 on a dynamic feedback correction basis, whereas upon presentation at input 101 of information bearing signals or pulses, pulse detector 102 forces the baseline corrector 105 to couple a constant, unchanging correction signal to the amplifier 104.

In order to coordinate the timing of the various operations, a delay unit 103 is interposed between the input 101 and amplifier 104. When a signal pulse occurs at the input 101, the pulse detector 102 immediately responds by generating a gating pulse to the baseline gate 107. See waveform B of FIG. 2. The duration of this pulse is equal to the time duration of the input pulse plus the delay time of delay line 103 designated $t_D$. The gating pulse applied to baseline gate 107 by detector 102 opens the path between amplifier output 108 and the input of baseline corrector 105. See waveform E of FIG. 2. The baseline corrector 105 in turn supplies the tracking signal necessary to force the output of amplifier 104 to be equal to the reference voltage 106. With the baseline gate 107 in the open state, the output of baseline corrector 105 is held at the level that existed before the applied input pulse was detected. See waveform D of FIG. 2. The input pulse will arrive at pulse amplifier 104 after a time delay equal to that of the delay line 103, and thence appear at the output of amplifier 104. See waveforms C and F of FIG. 2.

When the output signal level returns to zero, pulse detector 102 senses this transition internally, and in an additional time period equal to the propagation delay time of delay line 103 will terminate the output signal from detector 102, thereby insuring that the entire input signal passes through delay line 103 and pulse amplifier 104. See waveforms C through F of FIG. 2.

Figure 2:
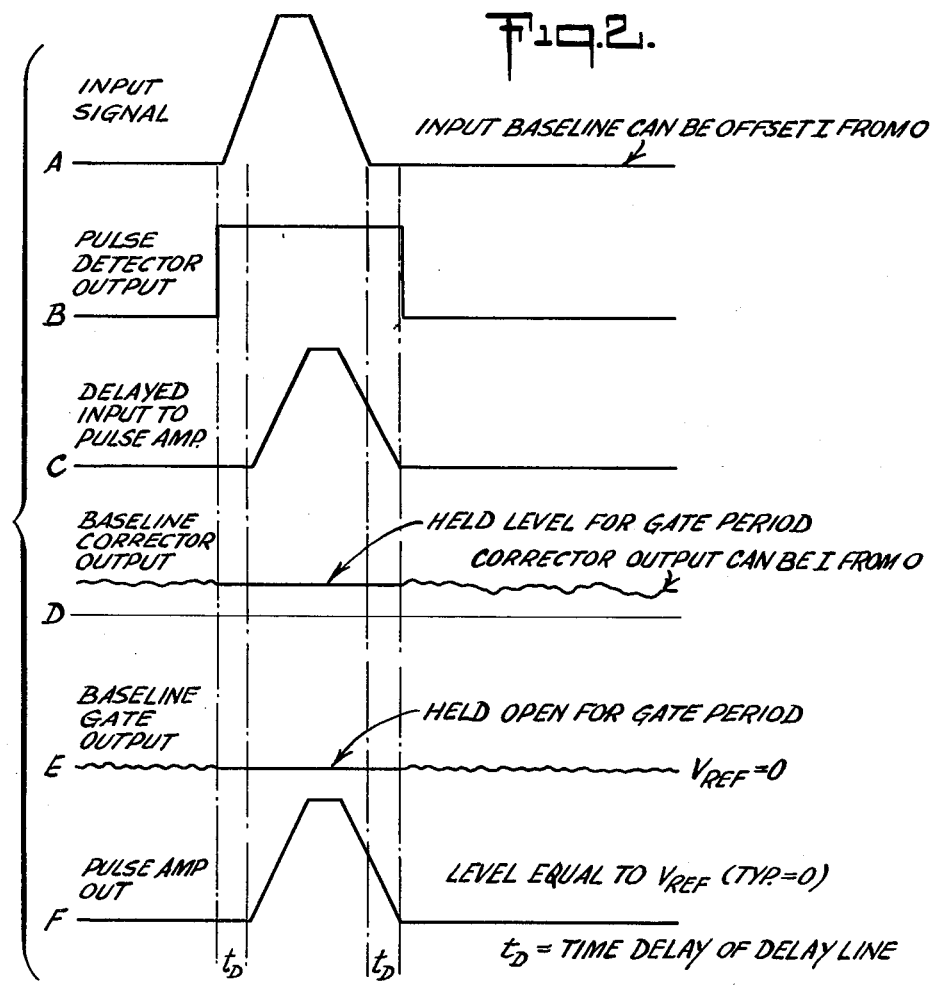
FIG. 2 parts A through F, shows a series of waveforms which illustrate the operation of the embodiment of FIG. 1.

Summarizing the operation based on the FIG. 2 waveforms, an exemplary signal for processing is shown as waveform A. Waveform B represents the output of the pulse detector 102; it will be seen that in waveform B, pulse detector initiates an output pulse upon first occurrence of the input signal pulse, which pulse continues until a time after termination of the input signal pulse equivalent to the time delay $t_D$ of delay line 103. Waveform C indicates the input pulse emerging from delay line 103 and being coupled to the pulse amplifier 104. Waveform D shows the output of the baseline corrector, which operates under the control of the output of the baseline gate 107, as shown in waveform E. It will be seen from waveforms D and E that, substantially in coincidence with the waveform B output pulse from detector 102, dynamic feedback is prevented, and the output of the baseline corrector 105 is held at its previous level, for the entire period of the pulse detector output. The output pulse from amplifier 104 is shown in waveform F.

Referring next to FIG. 3, there is shown a schematic of a circuit embodiment of the block diagrammatic version set forth in FIG. 1. The functional blocks of FIG. 1 are appropriately shown and numbered in FIG. 3.

Input signals are coupled to a delay unit 103, which is embodied as a "SPIRADEL" brand delay line commercially available from Allen Avionics, Inc. Advantageously, a 600 nanosecond delay is provided by delay line 103. From the delay unit 103, the signals are coupled to the amplifier 104, based about a National Semiconductor LH0032 amplifier, and associated feedback and biasing circuitry, conventionally designed to give proper high frequency compensation, proper bandwidth, transient elimination, and the like. Signals from the amplifier 104 are coupled to an output terminal 108. The output terminal 108 is coupled through successive resistors 210 and 208 to an amplifier 212 embodying the baseline corrector 105. For the embodiment of FIG. 3, the baseline is set at zero volts; accordingly, the non-inverting input of the amplifier 212 of baseline corrector 105 is coupled to a ground terminal 106. In turn, the output terminal of amplifier 212 is coupled to the main amplifier 104. A capacitor 213 is provided to remove high frequency switching transients from the feedback path. A capacitor 211 is connected in feedback arrangement with respect to amplifier 212; capacitor 211 serves as a storage and holding capacitor. That is, when dynamic feedback is forestalled in accordance with the principles of the present invention, capacitor 211 (with the exception of leakage, which is insignificant) holds the voltage thereon, which is in turn coupled to the amplifier 104.

The baseline gate 107 is embodied as a 2N5116 field effect transistor, having its drain terminal connected intermediate resistors 210 and 208, its source terminal grounded, and its gate terminal controlled from the pulse detector 102. During dynamic feedback correction in accordance with the principles of the present invention, the field effect transistor 107 is "off", and the output terminal 108 is coupled to amplifier 212 through the resistors 210 and 208. When an enabling pulse is received from the pulse detector 102, the field effect transistor 107 is turned "on", and the amplifier 212 has its input connected to ground through the resistor 208 and the "on" resistance of field effect transistor 107, typically 80-100 ohms.

In FIG. 3, the pulse detector 102 is embodied basically in two parts, a first amplifier 201 stage, having feedback connections with amplifiers 202 and 203, and a comparator 206 stage. The input signals from 101 are applied to the amplifier 201. Amplifier 202 has a diode 204 connected in feedback arrangement therewith, thereby providing a clipping action, and amplifier 203, along with capacitor 205 in feedback connection therewith, fulfills a similar baseline correcting operation with respect to amplifier 201, as is provided by amplifier 212 in connection with the main amplifier 104. The clipped, baseline corrected signal from amplifier 201 is coupled to one input terminal of the comparator 206, the other input of which receives a reference voltage for comparison, supplied by a resistive divider 207. Essentially, divider 207 provides a dc threshold for preventing switching of the gate transistor 107 based on spurious signals such as noise.

Amplifiers 201 and 202 are advantageously embodied as National Semiconductor LM357 units. Amplifiers 203 and 212 are advantageously embodied as National Semiconductor LM356 units. Comparator 361 is advantageously embodied as a National Semiconductor LM361 unit.

The foregoing has set forth preferred and illustrative embodiments of the principles of the present invention; numerous other embodiments will occur to those of ordinary skill in the art without departing from the spirit or scope of the principles of the present invention.

What is claimed is:

1. In a system for processing signals with respect to a predetermined baseline level, automatic baseline correcting means comprising:
   (a) an amplifier having an output and at least one input, signals to be processed being coupled to said input;
   (b) first feedback means, connected between the output and input of said amplifier for correcting the output level of said amplifier to said baseline level;
   (c) means for detecting the presence of signals to be processed;
   (d) means, responsive to the presence of signals at the input of said amplifier, for forcing said feedback means to supply an unchanging correction function to said amplifier for the duration of presence of said signals;
   (e) wherein said means for detecting includes
      (i) first amplifier means receiving said signals to be processed,
      (ii) second feedback means between the output and input of said first amplifier means, for correcting the output level of said first amplifier means to a predetermined baseline level,
      (iii) a reference voltage source, and
      (iv) comparator means, for comparing corrected signal form said first amplifier means with said reference level, and responsively thereto, for conditioning said means for forcing.

2. Apparatus as described in claim 1 and further including means for delaying application of said signals to be processed to the input of said amplifier pending detection by said means for detecting, and consequent disablement of said gating means.

* * * * *

UNITED STATES PATENT AND TRADEMARK OFFICE
CERTIFICATE OF CORRECTION

PATENT NO. : 4,237,424

DATED : December 2, 1980

INVENTOR(S) : Irving L. Weiner

It is certified that error appears in the above-identified patent and that said Letters Patent are hereby corrected as shown below:

Claim 1, col. 6, line 9, delete "form" and substitute --from-- therefor; and

Claim 2, col. 6, line 16, delete "gating" and substitute --forcing-- therefor.

Signed and Sealed this

Twenty-seventh Day of April 1982

[SEAL]

Attest:

GERALD J. MOSSINGHOFF

Attesting Officer     Commissioner of Patents and Trademarks